United States Patent
Davis et al.

(10) Patent No.: US 10,051,724 B1
(45) Date of Patent: Aug. 14, 2018

(54) STRUCTURAL GROUND REFERENCE FOR AN ELECTRONIC COMPONENT OF A COMPUTING DEVICE

(71) Applicant: Apple Inc., Cupertino, CA (US)

(72) Inventors: Derryk C. Davis, Cupertino, CA (US); John M. Brock, San Carlos, CA (US); Peteris K. Augenbergs, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 471 days.

(21) Appl. No.: 14/610,872

(22) Filed: Jan. 30, 2015

Related U.S. Application Data

(60) Provisional application No. 61/934,322, filed on Jan. 31, 2014.

(51) Int. Cl.
| | |
|---|---|
| *G06F 3/041* | (2006.01) |
| *H05K 1/02* | (2006.01) |
| *G06F 3/044* | (2006.01) |
| *G06F 1/16* | (2006.01) |

(52) U.S. Cl.
CPC ............. *H05K 1/0215* (2013.01); *G06F 1/16* (2013.01); *G06F 3/044* (2013.01); *G06F 2203/04103* (2013.01); *G06F 2203/04107* (2013.01)

(58) Field of Classification Search
CPC ....... H05K 1/0215; G06F 3/044; G06F 3/041; G06F 1/16; G06F 2203/04103; G06F 2203/04107
See application file for complete search history.

(56) References Cited

U.S. PATENT DOCUMENTS

| | | |
|---|---|---|
| 4,657,320 A | 4/1987 | Bamford et al. |
| 5,111,363 A | 5/1992 | Yagi et al. |
| 5,125,846 A | 6/1992 | Sampson et al. |
| 6,344,877 B1 | 2/2002 | Gowda et al. |
| 6,866,544 B1 | 3/2005 | Casey et al. |
| 7,106,261 B2 | 9/2006 | Nagel et al. |
| 7,123,292 B1 | 10/2006 | Seeger et al. |
| 7,130,174 B2 | 10/2006 | Mayai et al. |
| 7,262,369 B1 * | 8/2007 | English ............... H01L 23/04 174/370 |

(Continued)

FOREIGN PATENT DOCUMENTS

| | | |
|---|---|---|
| WO | WO2012058295 | 5/2012 |
| WO | WO-2012058295 | 5/2012 |

OTHER PUBLICATIONS

Author Unknown, "Copper Flex Products," www.molex.com, 6 pages, at least as early as Jul. 22, 2014.

*Primary Examiner* — Claire X Pappas
*Assistant Examiner* — Gerald Oliver
(74) *Attorney, Agent, or Firm* — David K. Cole

(57) ABSTRACT

Embodiments disclosed herein relate to an apparatus that provides structural support and an electrical ground for components of an electronic device. Specifically, one or more embodiments of the present disclosure provide a semi-rigid member having at least one screw boss. An electronic component is coupled to the semi-rigid member. In embodiments, the electronic component is coupled to the semi-rigid member using the at least one screw boss. As a separate component, the semi-rigid member is configured to provide an electrical ground for the electronic component and also provides structural support for the electronic component.

19 Claims, 4 Drawing Sheets

(56) References Cited

U.S. PATENT DOCUMENTS

| | | | |
|---|---|---|---|
| 7,380,948 B2 | 6/2008 | Schofield et al. | |
| 7,619,899 B2 | 11/2009 | Rubenstein et al. | |
| 7,822,338 B2 | 10/2010 | Wernersson | |
| 7,978,489 B1 | 7/2011 | Telefus et al. | |
| 7,989,709 B2 | 8/2011 | Tsao | |
| 8,361,830 B2 | 1/2013 | Yang et al. | |
| 8,385,258 B2 | 2/2013 | Perlman | |
| 8,430,402 B2 | 4/2013 | Diehl et al. | |
| 8,500,456 B1 | 8/2013 | Holec et al. | |
| 8,587,939 B2 * | 11/2013 | McClure | G06F 1/1626 312/223.1 |
| 8,708,746 B2 | 4/2014 | Altice et al. | |
| 8,730,372 B2 | 5/2014 | Dabov | |
| 8,905,684 B2 | 12/2014 | Waggle et al. | |
| 9,035,326 B2 | 5/2015 | Cho | |
| 9,074,915 B2 | 7/2015 | Kalhoff et al. | |
| 9,209,627 B2 | 12/2015 | Baarman et al. | |
| 2005/0073507 A1 * | 4/2005 | Richter | G06F 3/044 345/174 |
| 2005/0095410 A1 | 5/2005 | Mazurkiewicz | |
| 2005/0233122 A1 | 10/2005 | Nishimura et al. | |
| 2007/0032130 A1 | 2/2007 | Yoshino | |
| 2008/0037770 A1 * | 2/2008 | Emmert | H04M 1/026 379/433.01 |
| 2009/0001855 A1 * | 1/2009 | Lipton | G06F 3/016 310/331 |
| 2009/0213232 A1 | 8/2009 | Asakura et al. | |
| 2009/0257207 A1 * | 10/2009 | Wang | G06F 1/1626 361/752 |
| 2009/0273584 A1 * | 11/2009 | Staton | G06F 3/0418 345/178 |
| 2010/0141571 A1 | 6/2010 | Chiang et al. | |
| 2010/0177080 A1 | 7/2010 | Essinger et al. | |
| 2010/0315267 A1 * | 12/2010 | Chung | B60R 25/24 341/22 |
| 2011/0133208 A1 | 6/2011 | Nakahara | |
| 2011/0155417 A1 | 6/2011 | Hu et al. | |
| 2011/0164365 A1 * | 7/2011 | McClure | G06F 1/1613 361/679.3 |
| 2011/0255250 A1 * | 10/2011 | Dinh | G03B 15/03 361/749 |
| 2011/0304763 A1 | 12/2011 | Choi et al. | |
| 2012/0038562 A1 * | 2/2012 | Holman, IV | G06F 3/016 345/173 |
| 2012/0135632 A1 * | 5/2012 | Maher | H01R 12/67 439/393 |
| 2012/0147573 A1 * | 6/2012 | Lim | H05K 9/0028 361/753 |
| 2012/0176278 A1 * | 7/2012 | Merz | H01Q 1/243 343/702 |
| 2012/0270420 A1 | 10/2012 | Lapidot | |
| 2013/0076597 A1 * | 3/2013 | Becze | G06F 3/1438 345/1.3 |
| 2013/0082984 A1 | 4/2013 | Drzaic et al. | |
| 2013/0133947 A1 * | 5/2013 | Miller | G06F 3/044 174/84 C |
| 2013/0329450 A1 * | 12/2013 | Degner | G06F 1/1616 362/602 |
| 2014/0103943 A1 * | 4/2014 | Dunlap | G06K 9/00053 324/663 |
| 2014/0111953 A1 | 4/2014 | McClure et al. | |
| 2014/0177186 A1 * | 6/2014 | Song | H04M 1/0277 361/753 |
| 2014/0342577 A1 | 11/2014 | De Bruijn | |
| 2015/0116958 A1 | 4/2015 | Shedletsky et al. | |
| 2015/0130749 A1 * | 5/2015 | Binstead | G06F 3/044 345/174 |
| 2015/0138700 A1 | 5/2015 | Goyal et al. | |
| 2015/0146355 A1 | 5/2015 | Goyal et al. | |
| 2015/0146392 A1 * | 5/2015 | Yamashita | H04N 5/2251 361/753 |
| 2015/0194753 A1 | 7/2015 | Raff et al. | |
| 2015/0295332 A1 | 10/2015 | Shedletsky et al. | |

* cited by examiner

STRUCTURAL GROUND REFERENCE FOR AN ELECTRONIC COMPONENT OF A COMPUTING DEVICE

CROSS-REFERENCE TO RELATED APPLICATIONS

This application is a nonprovisional patent application of and claims the benefit to U.S. Provisional Patent Application No. 61/934,322, filed Jan. 31, 2014 and titled "Structural Ground Reference for an Electronic Component of a Computing Device," the disclosure of which is hereby incorporated herein by reference in its entirety.

TECHNICAL FIELD

The present disclosure is directed to a touch sensor for electronic computing devices. Specifically, the present disclosure is directed to a structure that provides structural support to the touch sensor as well as providing a ground reference for the touch sensor.

BACKGROUND

In certain computing devices, it may be desirable to have a thin form factor. However, as parts are removed or resized to achieve the thin form factor, the overall durability of the computing device may be diminished. For example, in some cases, as the computing device gets thinner, the computing device may bend or break more easily. In cases where components are removed, the computing device may not have the desired functionality.

It is with respect to these and other general considerations that embodiments have been made. Also, although relatively specific problems have been discussed, it should be understood that the embodiments should not be limited to solving the specific problems identified in the background.

SUMMARY

This summary is provided to introduce a selection of concepts in a simplified form that are further described below in the Detailed Description section. This summary is not intended to identify key features or essential features of the claimed subject matter, nor is it intended to be used as an aid in determining the scope of the claimed subject matter.

One or more embodiments of the present disclosure provide an apparatus that provides both structural support and an electrical ground for components of a computing device or other such electronic device. More specifically, one or more embodiments of the present disclosure provide a semi-rigid member having at least one screw boss. An electronic component is coupled to the semi-rigid member. The electronic component may be coupled to the semi-rigid member using the at least one screw boss. The semi-rigid member is also configured to provide an electrical ground for the electronic component and also provides structural support for the electronic component.

In another embodiment of the present disclosure, a device is disclosed that includes, among other components, a coated glass member, an adhesive layer, a touch sensor, and a gel plate configured as a semi-rigid member. A first side of the adhesive layer is coupled to an underside of the coated glass member. Likewise, a first side of the sensor is coupled to a second side of the adhesive layer. In some embodiments, a first side of the gel plate is coupled to a second side of the sensor. Further, at least one screw boss is coupled to the gel plate. In embodiments, the at least one screw boss is configured to secure the sensor to the gel plate to provide structural support for the sensor. Additionally, the gel plate is configured to provide an electrical ground for the sensor. The components listed above may form a sensing stack which may be used as a touch-sensitive portion of a computing device (e.g., a touch pad of a laptop computer, in input-sensitive housing of a computing device and the like).

In yet another embodiment of the present disclosure, a method is provided for securing and grounding components of an electronic device. The method includes coupling a semi-rigid member to an electronic component to provide structural support to the electronic component. Once the semi-rigid member has been coupled to the electronic component, the electronic component is electrically grounded by the semi-rigid member using one or more screw bosses coupled to the semi-rigid member.

BRIEF DESCRIPTION OF THE DRAWINGS

Reference will now be made to representative embodiments illustrated in the accompanying figures. It should be understood that the following descriptions are not intended to limit the disclosure to one preferred embodiment. To the contrary, each is intended to cover alternatives, modifications, and equivalents as may be included within the spirit and scope of the described embodiments as defined by the appended claims.

DETAILED DESCRIPTION

Various embodiments are described more fully below with reference to the accompanying drawings, which form a part hereof, and which show specific exemplary embodiments. However, embodiments may be implemented in many different forms and should not be construed as limited to the embodiments set forth herein; rather, these embodiments are provided so that this disclosure will be thorough and complete, and will fully convey the scope of the embodiments to those skilled in the art. The following detailed description is, therefore, not to be taken in a limiting sense.

One or more embodiments of the present disclosure are directed to touch sensors for computing devices. In embodiments, the touch sensors may be used for laptop computers, mobile phones, tablets and the like. Specifically, the sensors and the structures described herein may be used as opaque touch pads for laptop computers. Although touch pads are specifically mentioned, the components and structures disclosed herein could be used for touch sensitive regions, displays or housings for tablet computers, laptop computers, computer monitors, mobile phones, wearable electronic devices and the like.

Figure 1:
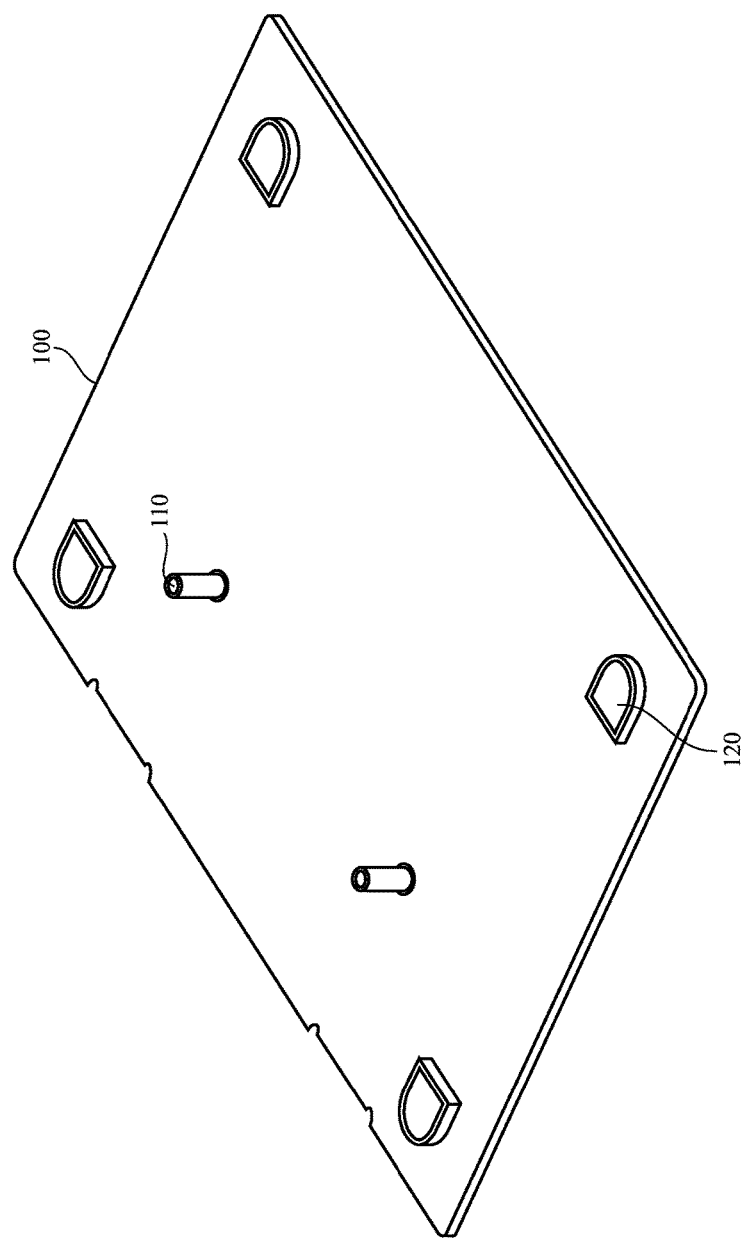
FIG. 1 illustrates an exemplary semi-rigid member that acts as a structural support and as a ground reference for an electronic component of an electronic device according to one or more embodiments of the present disclosure.

Referring to FIG. 1, FIG. 1 illustrates an exemplary semi-rigid member 100 that acts as structural support and as a ground reference for an electronic component of a computing device a. Specifically, the semi-rigid member 100 may be used as part of an electronic component for an electronic device that implements capacitive touch sensing and typically includes one or more pads 120. For example, the electronic component may be a capacitive housing, track pad or other such surface. Although a capacitive housing and a track pad are specifically mentioned, it is contemplated that the semi-rigid member 100 may be used in conjunction with a variety of capacitive sensors. By combining the ground reference and structural support as a single element or layer within an electronic device, the overall dimensions of the device may be reduced (and, in certain embodiments, the thickness of the device may be reduced).

In certain embodiments, the electronic component may support mutual capacitance sensing. That is, a location of a touch may be determined through a change in capacitance between two capacitive elements spaced apart from one another, typically (but not necessarily) spaced apart along the Z-axis. When a touch occurs in the region of one of the capacitive elements, the overall capacitance as measured between the two elements may change due to the capacitance of the finger or touching object. This change in capacitance may be sensed and the location of the touch assigned to the corresponding region. In certain embodiments, a first array of capacitive elements may be configured to cover or correspond to an entirety (or near-entirety) of a touch surface, with a second array of capacitive elements disposed beneath the first array. The change in capacitance due to a touch may be measured from any elements of the first array to the underlying element of the second array.

In many embodiments that employ mutual capacitance systems, a reference or ground plane structure may assist in the sensing of a touch. For example, the ground plane may operate to shield one or both of the capacitive arrays from external noise, such as may be produced by other electronic components operating in the device, or from the object itself. Likewise, the plane may provide a reference voltage (such as a ground voltage) against which changes in capacitance may be measured. Further, it should be appreciated that such a reference structure may be located above or below the mutual capacitance arrays.

Other embodiments may employ self-capacitance structures to detect the location of a touch. In a self-capacitance structure, one or more of an array of capacitive elements may capacitively couple to a finger or object touching a cover glass or other surface. This capacitive coupling may change the value of the capacitance at the corresponding capacitive element, which may be interpreted as a touch. In such systems, a reference or ground structure may be useful for many of the reasons set forth above in the discussion of mutual capacitance.

In certain embodiments, the semi-rigid member 100 includes a stainless steel plate having a thickness of 0.2 mm and one or more pads 120 or other compliant members. In other embodiments, the semi-rigid member 100 may be an anodized aluminum plate. In still yet another embodiment, the semi-rigid member 100 is made of titanium. Although specific materials are mentioned, it is contemplated that any material may be used so as to enable the semi-rigid member 100 to act as both a structural support and a ground reference for certain electronic components.

As briefly discussed above, the semi-rigid member 100 may also include one or more pads 120. The pads 120 may be made be comprised of a gel, a polymer or other material. The pads 120 may be used to help insulate one or more electronic components that are coupled to the semi-rigid member 100 or may be used to help secure the one or more electronic components to the semi-rigid member 100. Although four pads 120 are specifically shown, it is contemplated that the semi-rigid member 100 may have any number of pads 120 secured thereon. Further, it is contemplated that the pads 120 may be placed in any desired configuration or orientation, such as, for example, in a configuration that matches or corresponds to the electrical component that is coupled to the semi-rigid member 100.

As also shown in FIG. 1, the semi-rigid member 100 includes one or more threaded screw bosses 110. Although only two screw bosses 110 are shown, it is contemplated that any number of screw bosses 110 may be provided on the semi-rigid member 100. For example, in one embodiment, a screw boss 110 may be placed at each corner of the semi-rigid member 100 in order to facilitate securement of an electrical component (e.g., a track pad or touch pad for a laptop computer) a mechanical device or component (e.g., buttons, switches and the like). The screw bosses 110 may be welded, press fit, machined, or otherwise coupled to the semi-rigid member 100.

As will be discussed below, the screw bosses 110 are used to secure the electrical component to the semi-rigid member 100 and may also be used to provide the ground reference. For example, when an electrical component is secured to the semi-rigid member 100, the one or more electrical connections may be secured to the screw bosses 110 and/or the semi-rigid member 100 to provide an electrical ground for the electrical component.

Figure 2:
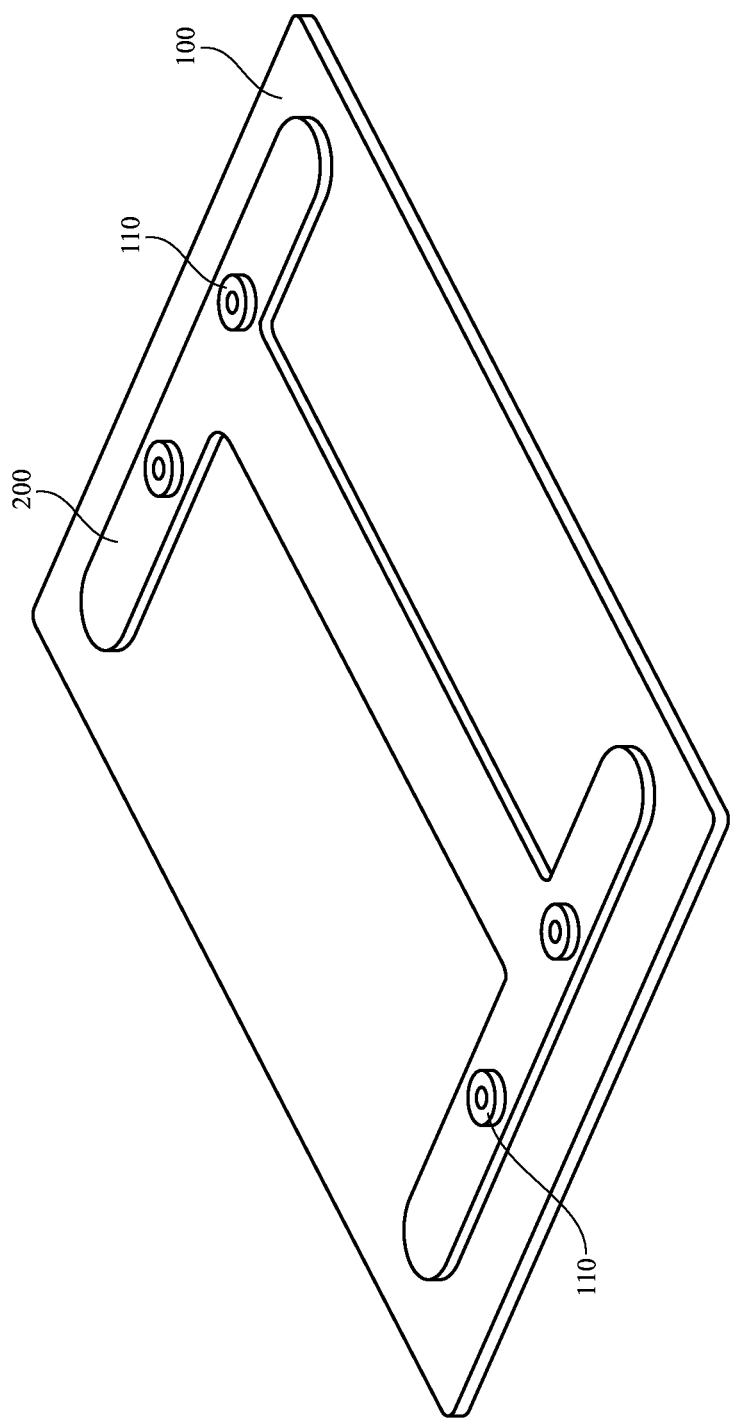
FIG. 2. illustrates an exemplary electronic component coupled a semi-rigid member according to one or more embodiments of the present disclosure.

For example, with respect to FIG. 2, FIG. 2, illustrates an exemplary electronic component 200 coupled the semi-rigid member 100 of FIG. 1 according to one or more embodiments of the present disclosure. The electronic component 200 may be a sensor (e.g., sensor of a touch pad, track pad, housing, or other electronic device, an actuator, or the like). As shown in FIG. 1, the electronic component 200 is secured to the semi-rigid member 100 using a plurality of screw bosses 110. As discussed above, the semi-rigid member 100 provides structural support for the electronic component 200 when the electronic component 200 is coupled to the semi-rigid member 100 using the screw bosses 110. Additionally, the semi-rigid member 100, via the screw bosses 110, may provide an electrical ground for the electronic component 200.

Figure 3:
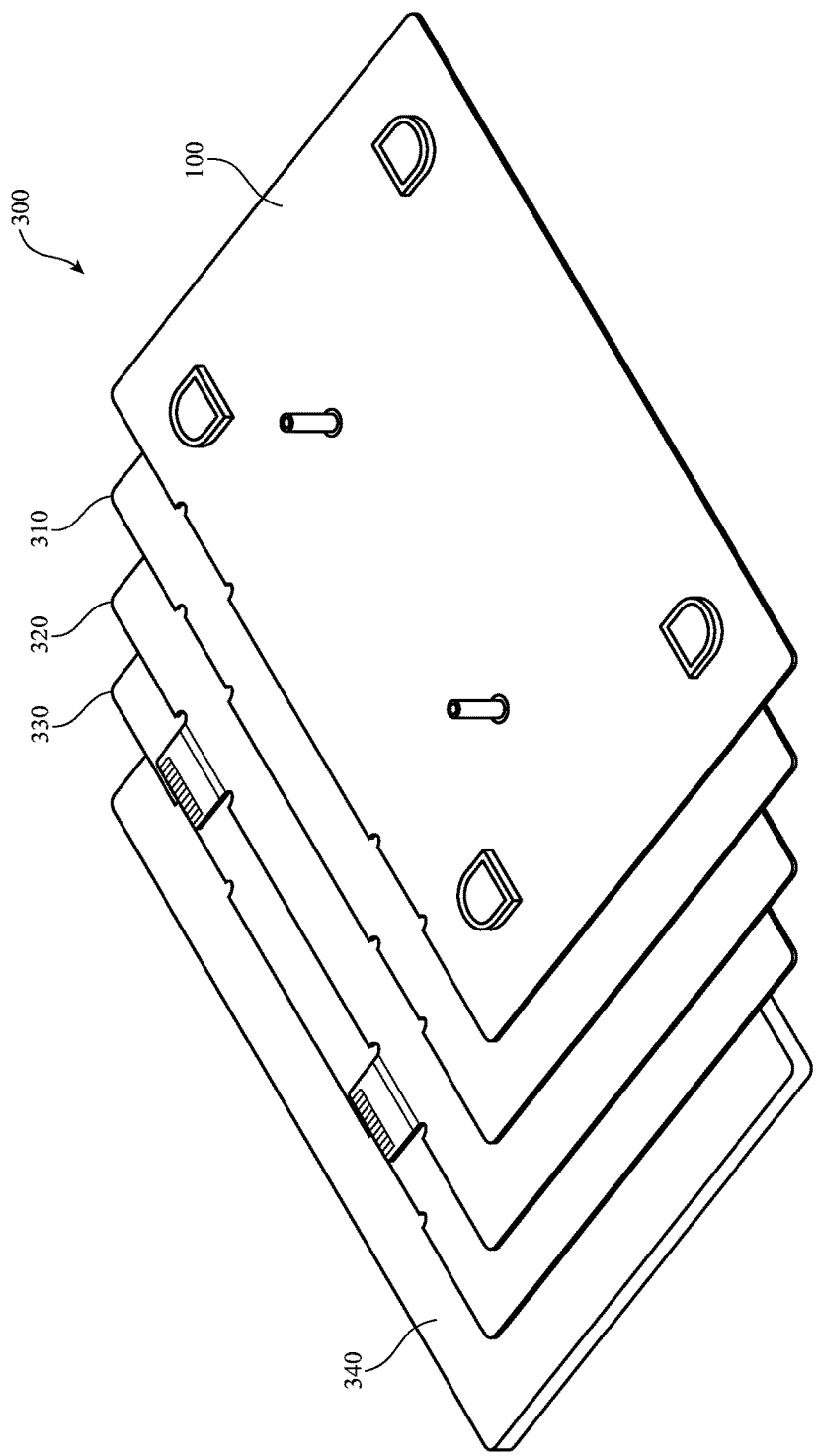
FIG. 3 illustrates a sensing stack for an electronic device according to one or more embodiments of the present disclosure.

FIG. 3 illustrates a touch-sensitive sensing stack 300 for an electronic device according to one or more embodiments of the present disclosure. The sensing stack 300 is comprised of a number of different components. The sensing stack 300 may be used as a touch pad, a track pad and the like. Although a touch pad and a track pad are specifically mentioned, it is contemplated that one or more of the components described herein may be used with other electronic components and in other configurations (e.g., touch-sensitive housing for a tablet computer, laptop computer mobile phone and the like). The semi-rigid member 100 provides structural support and acts as a ground reference to one or more of the components that make up the sensing stack 300. Components of the sensing stack may include one or more arrays of capacitive elements in order to sense capacitance through mutual- or self-capacitance, as discussed above.

Referring to FIG. 3, the sensing stack 300 includes a semi-rigid member such as, for example, the semi-rigid member 100 described above with respect to FIG. 1. The semi-rigid member 100 may be a gel plate such as, for example, gel plate 310. As such, the sensing stack 300 may include a gel plate 310, a sensor 320 (e.g., a touch sensor) and an adhesive layer 330.

The gel plate 310 may be used to protect the components of the sensing stack 300 as well as to enable the sensor 320 to more accurately track movement. As shown in FIG. 3, the sensing stack 300 also includes an adhesive layer 330. The adhesive layer 330 may be a pressure-sensitive adhesive layer 330 that may be used to secure the sensor 320 to a housing or other component. As discussed, the semi-rigid member 100 is used to provide structural support for the sensor 320. Additionally, the adhesive layer 330 may also be used to secure sensor 320 to a glass member 340 such as described below.

In some embodiments, the glass member 340 is a coated glass structure that covers the sensing stack 300 and is used to receive physical touch from a user of the sensing stack 300 (e.g., finger movement of a user on an input pad, such as a touch pad, of a computing device, or input from a stylus or other such mechanism). In certain embodiments, the glass member 340 may be cosmetically altered to have different colors, shape, designs, opacities and the like.

In certain embodiments, the gel plate 310 may have a thickness of 0.130 mm, the sensor 320 may have a thickness of 0.105 mm, the adhesive layer 330 may have a thickness of 0.05 mm, and the glass member 340 may have a thickness of 1.11 mm. Given the above measurements, it is contemplated that the sensing stack 300 may have an overall thickness of 2.245 mm. Although specific measurements have been mentioned, it is contemplated that each of the components listed above may have different dimensions, widths and so on. However, given that the semi-rigid member 100 acts as a structural component and a ground component, the overall part count of the sensing stack 300 may be less than current implementations. Likewise, the overall thickness of the sensing stack 300 may be thinner than current implementations.

As discussed above, one or more components of the sensing stack 300, such as, for example, the sensor 320 may be electrically grounded to the semi-rigid member 100. Further, one or more additional components may be coupled and/or electrically grounded to the semi-rigid member 100. For example, an actuator may be coupled to the semi-rigid member 100 using one or more screw bosses 110 (FIG. 1) on one side of the semi-rigid member 100 while the sensor 320 may be coupled on the opposite side of the semi-rigid member 100. Such a configuration may enable fragile components of a sensing stack (e.g., foil-on-plastic tail connections) to be removed from the overall electronic device in which the sensing stack 300 will be placed.

Figure 4:
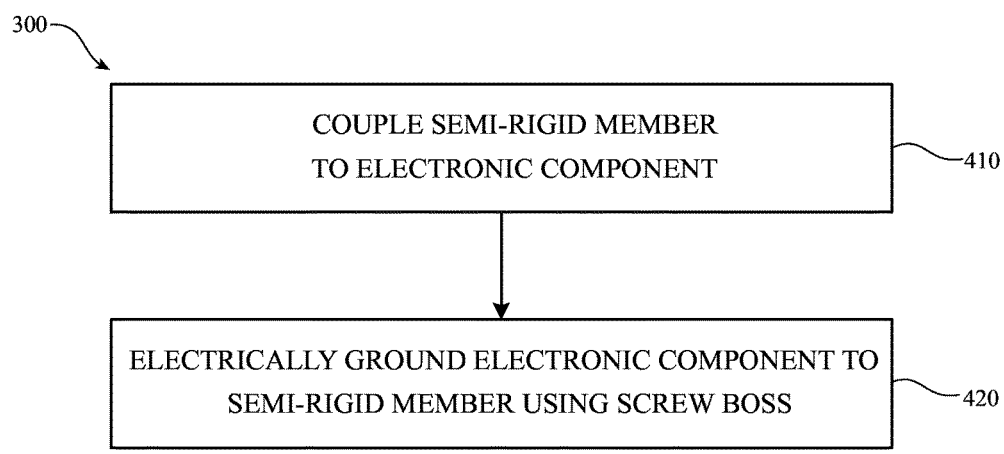
FIG. 4 illustrates a method for securing and grounding components of an electronic device according to one or more embodiments of the present disclosure.

FIG. 4 illustrates a method 400 for securing and grounding components of an electronic device according to one or more embodiments of the present disclosure. In certain embodiments, the method 400 may be used to form the sensing stack 300 disclosed above with respect to FIG. 3.

Method 400 begins when a semi-rigid member, such as, for example, semi-rigid member 100 (FIG. 1) is coupled 410 to an electronic component, such as, for example, sensor 320 (FIG. 3). In certain embodiments, the electronic component is secured to the semi-rigid member using an adhesive. In another embodiment, the electronic component is secured to the semi-rigid member using one or more screw bosses, such as, for example, screw bosses 110 (FIG. 1).

Once the electronic component is secured to the semi-rigid member, flow proceeds to operation 420 in which the electronic component is electrically ground to the semi-rigid member. In certain embodiments, the electrical ground connection is facilitated by at least one screw boss. As discussed above, the screw boss may be used to secure the electronic component to the semi-rigid member as well as to provide the electrical ground for the electronic component.

Embodiments of the present disclosure are described above with reference to block diagrams and operational illustrations of methods and the like. The operations described may occur out of the order as shown in any of the figures. Additionally, one or more operations may be removed or executed substantially concurrently. For example, two blocks shown in succession may be executed substantially concurrently. Additionally, the blocks may be executed in the reverse order.

The description and illustration of one or more embodiments provided in this disclosure are not intended to limit or restrict the scope of the present disclosure as claimed. The embodiments, examples, and details provided in this disclosure are considered sufficient to convey possession and enable others to make and use the best mode of the claimed embodiments. Additionally, the claimed embodiments should not be construed as being limited to any embodiment, example, or detail provided above. Regardless of whether shown and described in combination or separately, the various features, including structural features and methodological features, are intended to be selectively included or omitted to produce an embodiment with a particular set of features. Having been provided with the description and illustration of the present application, one skilled in the art may envision variations, modifications, and alternate embodiments falling within the spirit of the broader aspects of the embodiments described herein that do not depart from the broader scope of the claimed embodiments.

We claim:

1. An apparatus comprising:
a semi-rigid member comprising a plate and at least one pad affixed to the plate;
at least one screw boss directly coupled to a first side of the semi-rigid member;
an actuator directly coupled to the at least one screw boss;
a first electronic component coupled to the first side of the semi-rigid member, the first electronic component being coupled to the semi-rigid member using the at least one screw boss, wherein the semi-rigid member is configured to provide an electrical ground for the electronic component and to provide structural support for the electronic component; and
a second electronic component coupled to a second side of the semi-rigid member, wherein the second side is opposite the first side.

2. The apparatus of claim 1, wherein the at least one screw boss is press-fit to the semi-rigid member.

3. The apparatus of claim 1, wherein the at least one screw boss is welded to the semi-rigid member.

4. The apparatus of claim 1, wherein the at least one screw boss is used to provide the electrical ground for the first electronic component.

5. The apparatus of claim 1, wherein the at least one screw boss is further configured to receive at least one additional mechanical device.

6. The apparatus of claim 1, wherein the semi-rigid member is one of stainless steel and titanium.

7. The apparatus of claim 1, wherein the semi-rigid member is anodized aluminum.

8. A device comprising:
a coated glass member;
an adhesive layer, wherein a first side of the adhesive layer is coupled to an underside of the coated glass member;
a sensor, wherein a first side of the sensor is coupled to a second side of the adhesive layer;
a gel plate, wherein a first side of the gel plate is coupled to a second side of the sensor, and wherein the gel plate is configured as a semi-rigid member and comprises:
a plate having opposing first and second surfaces;
a pad affixed to the second surface of the plate; and
a first screw boss directly coupled to the second surface of the plate; and
a second screw boss that is configured to secure the sensor to the gel plate, wherein the gel plate is configured to provide an electrical ground for the sensor and to provide structural support for the sensor.

9. The device of claim 8, wherein the second screw boss is press-fit to the gel plate.

10. The device of claim 8, wherein the second screw boss is welded to the gel plate.

11. The device of claim 8, wherein the second screw boss is used to provide the electrical ground for the sensor.

12. The device of claim 8, wherein the at least one of the first and second screw bosses is further configured to receive at least one additional mechanical device.

13. The device of claim 12, wherein the at least one additional mechanical device is an actuator.

14. The device of claim 8, wherein the plate is comprised of either stainless steel or titanium.

15. The device of claim 8, wherein the plate is approximately 0.2 mm thick.

16. The device of claim 8, wherein the sensor is a capacitive sensor.

17. The device of claim 8, wherein the device is a laptop and the sensor is a touch sensor for the laptop.

18. A method for securing and grounding components of an electronic device, the method comprising:
coupling a touch sensor to a touch-sensitive glass portion of a housing of the electronic device with a layer of adhesive, wherein the layer of adhesive directly contacts the touch sensor and the touch-sensitive glass portion;
coupling a first side of a semi-rigid member to the touch sensor to provide structural support for the touch sensor;
electrically grounding the touch sensor to the semi-rigid member using a first screw boss coupled to the semi-rigid member and directly coupled to the touch sensor; and
coupling an actuator to a second side of the semi-rigid member using a second screw boss, wherein the second side is opposite the first side.

19. The method of claim 18, wherein coupling the electronic component to the second side of the semi-rigid member comprises grounding the electronic component to the semi-rigid member.

* * * * *